(12) United States Patent
Tankielun et al.

(10) Patent No.: US 11,476,955 B2
(45) Date of Patent: Oct. 18, 2022

(54) MEASUREMENT SYSTEM AND METHOD FOR INVESTIGATING A DUT WITH RESPECT TO ITS TEMPERATURE BEHAVIOR

(71) Applicant: Rohde & Schwarz GmbH & Co. KG, Munich (DE)

(72) Inventors: Adam Tankielun, Ottobrunn (DE); Corbett Rowell, Munich (DE); Vincent Abadie, Hohenschaeftlarn (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 549 days.

(21) Appl. No.: 15/900,365

(22) Filed: Feb. 20, 2018

(65) Prior Publication Data

US 2019/0109653 A1    Apr. 11, 2019

(30) Foreign Application Priority Data

Oct. 5, 2017    (EP) ..................... 17194919

(51) Int. Cl.
  *H04B 17/10* (2015.01)
  *G01R 29/10* (2006.01)
  *G01M 99/00* (2011.01)

(52) U.S. Cl.
  CPC ........ *H04B 17/103* (2015.01); *G01M 99/002* (2013.01); *G01R 29/105* (2013.01)

(58) Field of Classification Search
  CPC . H04B 17/103; G01M 99/002; G01R 29/105; G01R 31/2874; G01R 31/003; G01D 21/00
  USPC ................. 374/5; 324/703, 762.01, 612, 627
  See application file for complete search history.

(56) References Cited

U.S. PATENT DOCUMENTS

| | | | | | |
|---|---|---|---|---|---|
| 4,645,358 | A | * | 2/1987 | Blume | G01K 11/006 250/341.6 |
| 4,860,602 | A | * | 8/1989 | Hines | G01M 99/002 73/865.9 |
| 5,903,163 | A | * | 5/1999 | Tverdy | G01R 31/2849 324/750.08 |
| 2002/0135389 | A1 | * | 9/2002 | Melgaard | G01R 31/2874 324/750.05 |
| 2016/0183108 | A1 | * | 6/2016 | Mehrgardt | H04B 1/3822 455/456.1 |
| 2017/0016944 | A1 | * | 1/2017 | Esplin | G01R 29/105 |

* cited by examiner

*Primary Examiner* — Lisa M Caputo
*Assistant Examiner* — Janice M Soto
(74) *Attorney, Agent, or Firm* — Ditthavong, Steiner & Mlotkowski

(57) ABSTRACT

An over-the-air measurement system for investigating a device under test with respect to its temperature behavior is provided. The over-the-air measurement system includes a positioning unit attached to the device under test for positioning the device under test, at least one antenna, and a temperature generating unit for generating heated or cooled air. The over-the-air measurement system includes a piping system comprising at least one pipe connected to the temperature generating unit for passing the heated or cooled air generated by the temperature generating unit into at least one opening of an enveloping material surrounding the device under test or for siphoning the heated or cooled air.

15 Claims, 10 Drawing Sheets

MEASUREMENT SYSTEM AND METHOD FOR INVESTIGATING A DUT WITH RESPECT TO ITS TEMPERATURE BEHAVIOR

PRIORITY

This application claims priority of European patent application EP 17 194 919.1 filed on Oct. 5, 2017, which is incorporated by reference herewith.

FIELD OF THE INVENTION

The invention relates to an over-the-air measurement system and method for investigating a device under test with respect to its temperature behavior.

BACKGROUND OF THE INVENTION

Generally, in times of an increasing number of wireless communication applications being exposed to different ambient conditions such as varying temperatures, there is a growing need of an over-the-air measurement system and method for investigating a device under test with respect to its temperature behavior.

US 2017/0016944 A1 relates to methods and apparatus for thermal testing of an antenna as a device under test. Embodiments enable positioning a unit under test having an antenna in an anechoic chamber and manipulating a RF (radio frequency) transparent heat chamber over the antenna. In this context, a system can raise a temperature in the heat chamber to a selected temperature and obtain antenna performance information while the antenna is heated in the heat chamber. Furthermore, temperature affects on antenna performance can be determined. However, due to a lack of movability with respect to major parts of said apparatus and the limited accessibility, especially regarding the device under test, caused thereby, thermal testing is inefficient.

Accordingly, there is the object to provide an over-the-air measurement system and method for investigating a device under test with respect to its temperature behavior in a most efficient manner especially by avoiding a limited accessibility.

This object is solved by the features of claim 1 for an over-the-air measurement system and claim 15 for an over-the-air measurement method. The dependent claims contain further developments.

SUMMARY OF THE INVENTION

According to a first aspect of the invention, an over-the-air measurement system for investigating a device under test with respect to its temperature behavior is provided. The over-the air measurement system comprises a positioning unit attached to the device under test for positioning the device under test, at least one antenna, a temperature generating unit for generating heated or cooled air, and a piping system comprising at least one pipe connected to the temperature generating unit for passing the heated or cooled air generated by the temperature generating unit into at least one opening of an enveloping material surrounding the device under test and/or for siphoning the heated or cooled air. In this context, the positioning unit and the piping system are configured to relatively move and/or rotate the device under test with respect to the at least one antenna.

Advantageously, with the aid of said relative movability and/or rotatability, a limited accessibility, especially a limited accessibility with respect to the device under test or major parts of the over-the-air measurement system, is avoided.

According to a first preferred implementation form of the first aspect, the over-the-air measurement system further comprises a measuring unit connected to the at least one antenna for transmitting and/or receiving at least one test signal with respect to the device under test in order to investigate the device under test. Advantageously, the over-the-air measurement system allows for both transmitting and receiving measurements.

According to a further preferred implementation form of the first aspect, the at least one antenna is a single antenna, an antenna array, a near-field to far-field transform device, or an over-the-air probe. Advantageously, the over-the-air measurement system allows for investigating various types of test signals transmitted to and/or received form the device under test.

According to a further preferred implementation form of the first aspect, the enveloping material is a radio frequency neutral material. Additionally or alternatively, the enveloping material partially or completely surrounds the device under test with respect to a certain measurement direction. Advantageously, the enveloping material embodied as a radio frequency neutral material does not influence measurements with respect to radio frequency signals. In other words, the radio frequency neutral material is invisible for radio frequency signals, especially for radio frequency waves or beams.

According to a further preferred implementation form of the first aspect, the over-the-measurement system further comprises at least one temperature sensor connected to the measuring unit and/or the temperature generating unit for monitoring an ambient temperature in the area of the device under test. Advantageously, a desired temperature at which the device under test should be tested can be accurately set.

According to a further preferred implementation form of the first aspect, the over-the-air measurement system further comprises an air pressure adjusting unit for creating a higher or a lower air pressure with respect to the at least one pipe of the piping system. Advantageously, changing a temperature with respect to the device under test can be accelerated or decelerated.

According to a further preferred implementation form of the first aspect, the piping system comprises at least two pipes, wherein with the aid of the air pressure adjusting unit, at least one first pipe provides a higher air pressure and at least one second pipe provides a lower air pressure such that a certain or circular flow of air is created with respect to the device under test. Additionally, the certain flow air created with respect to the device under test may preferably be a user-defined flow of air. Advantageously, the device under test can be investigated with respect to its temperature behavior in a most accurate manner.

According to a further preferred implementation form of the first aspect, the at least one opening of the enveloping material is configured to balance air pressure with respect to the device under test. Additionally or alternatively, the enveloping material comprises at least one additional cutout or recess configured to balance air pressure with respect to the device under test. Advantageously, fatigue caused by air pressure changes with respect to the enveloping material is avoided.

According to a further preferred implementation form of the first aspect, the at least one opening of the enveloping material comprises a heat-resistant connection area for connecting the at least one pipe of the piping system. Additionally or alternatively, an area of the enveloping material partially or completely surrounding the at least one opening of the enveloping material is heat-resistant. Advantageously, the enveloping material cannot be damaged by temperature differences.

According to a further preferred implementation form of the first aspect, the positioning unit comprises the piping system. Advantageously, a required space is reduced to a minimum.

According to a further preferred implementation form of the first aspect, the at least one pipe of the piping system is embodied as a single tube. Advantageously, said single tube is configured to pass and siphon air.

According to a further preferred implementation form of the first aspect, the enveloping material is embodied as a not fully radio frequency neutral material. Advantageously, the test signal transmitted to or received from the device under test, especially in the form of a radio frequency wave or beam, can be reflected or formed in a certain manner.

According to a further preferred implementation form of the first aspect, the not fully radio frequency neutral material comprises metal, wherein a metallic portion with respect to the not fully radio frequency neutral material is between 40% and 60%. Advantageously, with respect to the test signal transmitted to or received from the device under test, a degree of reflection can be adjusted.

According to a further preferred implementation form of the first aspect, with the aid of the temperature generating unit, the at least one pipe is configured to siphon condensate with respect to the device under test and/or the over-the-air measurement system. Additionally or alternatively, the over-the-air measurement system, especially the positioning unit of the over-the-air measurement system, further comprises at least one additional tube for siphoning condensate with respect to the device under test and/or the over-the-air measurement system. Advantageously, faulty measurements due to condensate are avoided.

According to a second aspect of the invention, an over-the-air measurement method for investigating a device under test with respect to its temperature behavior is provided. The over-the air measurement method comprises the steps of positioning the device under test with the aid of a positioning unit attached to the device under test, transmitting and/or receiving at least one test signal with respect to the device under test with the aid of a measuring unit connected to at least one antenna in order to investigate the device under test, partially or completely surrounding the device under test with enveloping material comprising at least one opening, generating heated or cooled air with the aid of a temperature generating unit connected to the measuring unit, and passing the heated or cooled air generated by the temperature generating unit into the at least one opening of the radio frequency neutral material and/or siphoning the heated or cooled air with the aid of a piping system comprising at least one pipe connected to the temperature generating unit. In this context, with the aid of the positioning unit and/or the piping system, the device under test is relatively moved and/or rotated with respect to the at least one antenna. Advantageously, with the aid of said relative movability and/or rotatability, a limited accessibility, especially a limited accessibility with respect to the device under test or major parts of the over-the-air measurement system, is avoided.

According to a first preferred implementation form of the second aspect, the at least one antenna is a single antenna, an antenna array, a near-field to far-field transform device, or an over-the-air probe. Advantageously, the over-the-air measurement system allows for investigating various types of test signals transmitted to and/or received form the device under test.

According to a further preferred implementation form of the second aspect, the enveloping material is a radio frequency neutral material. Additionally or alternatively, the enveloping material partially or completely surrounds the device under test with respect to a certain measurement direction. Advantageously, the enveloping material embodied as a radio frequency neutral material does not influence measurements with respect to radio frequency signals. In other words, the radio frequency neutral material is invisible for radio frequency signals, especially for radio frequency waves or beams.

According to a further preferred implementation form of the second aspect, at least one temperature sensor connected to the measuring unit and/or the temperature generating unit is used for monitoring an ambient temperature in the area of the device under test. Advantageously, a desired temperature at which the device under test should be tested can be accurately set.

According to a further preferred implementation form of the second aspect, an air pressure adjusting unit is used for creating a higher or a lower air pressure with respect to the at least one pipe of the piping system. Advantageously, changing a temperature with respect to the device under test can be accelerated or decelerated.

According to a further preferred implementation form of the second aspect, the piping system comprises at least two pipes, wherein with the aid of the air pressure adjusting unit, at least one first pipe provides a higher air pressure and at least one second pipe provides a lower air pressure such that a certain or circular flow of air is created with respect to the device under test. Additionally, the certain flow air created with respect to the device under test may preferably be a user-defined flow of air. Advantageously, the device under test can be investigated with respect to its temperature behavior in a most accurate manner.

According to a further preferred implementation form of the second aspect, the at least one opening of the enveloping material is configured to balance air pressure with respect to the device under test. Additionally or alternatively, the enveloping material comprises at least one additional cutout or recess configured to balance air pressure with respect to the device under test. Advantageously, fatigue caused by air pressure changes with respect to the enveloping material is avoided.

According to a further preferred implementation form of the second aspect, the at least one opening of the enveloping material comprises a heat-resistant connection area for connecting the at least one pipe of the piping system. Additionally or alternatively, an area of the enveloping material partially or completely surrounding the at least one opening of the enveloping material is heat-resistant. Advantageously, the enveloping material cannot be damaged by temperature differences.

According to a further preferred implementation form of the second aspect, the positioning unit comprises the piping system. Advantageously, a required space is reduced to a minimum.

According to a further preferred implementation form of the second aspect, the at least one pipe of the piping system is embodied as a single tube. Advantageously, said single tube is configured to pass and siphon air.

According to a further preferred implementation form of the second aspect, the enveloping material is embodied as a not fully radio frequency neutral material. Advantageously, the test signal transmitted to or receiving from the device under test, especially in the form of a radio frequency wave or beam, can be reflected or formed in a certain manner.

According to a further preferred implementation form of the second aspect, the not fully radio frequency neutral material comprises metal, wherein a metallic portion with respect to the not fully radio frequency neutral material is between 40% and 60%. Advantageously, with respect to the test signal transmitted to or received from the device under test, a degree of reflection can be adjusted.

According to a further preferred implementation form of the second aspect, with the aid of the temperature generating unit, the at least one pipe is configured to siphon condensate with respect to the device under test. Additionally or alternatively, the positioning unit further comprises at least one additional tube for siphoning condensate with respect to the device under test. Advantageously, faulty measurements due to condensate are avoided.

BRIEF DESCRIPTION OF THE DRAWINGS

Exemplary embodiments of the invention are now further explained with respect to the drawings by way of example only, and not for limitation. In the drawings.

DETAILED DESCRIPTION OF PREFERRED EMBODIMENTS

Figure 1:
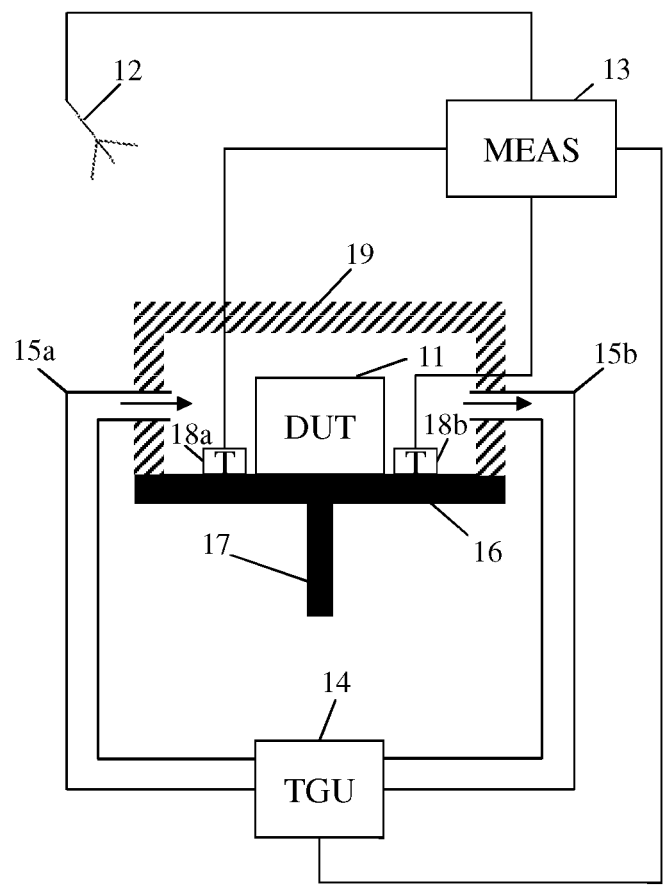
FIG. 1 shows an exemplary embodiment of the first aspect of the invention.

FIG. 1 illustrates an exemplary embodiment of an over-the-air measurement system for investigating a device under test 11 with respect to its temperature behavior. The invention is not limited to this embodiment and all features below are explained for the purpose of example only.

Said over-the-air measurement system comprises a positioning unit attached to the device under test 11 for positioning the device under test 11, wherein the positioning unit comprises a plane 16 being rotatable around an axis 17. Additionally or alternatively, the axis may allow for height adjustment or tilting or a combination thereof.

Furthermore, the over-the-air measurement system comprises an antenna 12 being preferably movable, rotatable, tiltable, pivotable, or any combination thereof. Said antenna 12 is connected to a measuring unit 13 for transmitting and/or receiving at least one test signal with respect to the device under test 11 in order to investigate the device under test.

Moreover, especially for investigating the device under test 11 with respect to its temperature behavior, the over-the-air measurement system comprises a temperature generating unit 14 being configured to generate heated or cooled air. With the aid of a piping system connected to said temperature generating unit 14 and comprising a first pipe 15a and a second pipe 15b, the device under test 11 can be heated or cooled. Additionally, in order to hold the desired temperature with respect to the device under test 11, the device under test 11 is surrounded by an enveloping material 19.

In this exemplary case, said first pipe 15a passes heated or cooled air generated by the temperature generating unit into a first opening of the enveloping material 19, whereas the air having passed the device under test 11 is siphoned with the aid of the second pipe 15b connected to a second opening of the enveloping material 19.

In addition to this, in order to monitor an ambient temperature in the area of the device under test 11, the over-the-air measurement system comprises exemplarily two temperature sensors 18a, 18b being connected to measuring unit 13. Additionally or alternatively, said temperature sensors 18a and 18b may preferably be connected to the temperature generating unit 14.

Advantageously, the positioning unit comprising plane 16 and axis 17 and the piping system comprising pipes 15a and 15b are configured to relatively move and/or rotate the device under test 11 with respect to the antenna 12. In this context, it may be further advantageous if the positioning unit comprises the piping system.

Additionally, with respect to said antenna 12, it is noted that the antenna 12 may be a single antenna, an antenna array, a near-field to far-field transform device, or an over-the-air probe. In this context, an over-the-air probe will exemplarily be explained according to FIG. 12.

Further additionally, with respect to said enveloping material 19, it is noted that in this exemplary case according to FIG. 1, the enveloping material 19 is a radio frequency neutral material completely surrounding the device under test 11. Alternatively, the enveloping material may not completely surround the device under test 11. Further alternatively, the enveloping material 19 may be embodied as a not fully radio frequency neutral material. Additionally, in the case of a not fully radio frequency neutral material, the not fully radio frequency neutral material may preferably comprise metal, wherein especially a metallic portion with respect to the not fully radio frequency neutral material is between 40% and 60%.

Moreover, with respect to said first and second opening of the enveloping material 19, it is noted that at least one of these openings comprises a heat-resistant connection area for connecting the respective one of the pipes 15a and 15b of the piping system. Additionally or alternatively, an area of the enveloping material 19 partially or completely surrounding at least one of said openings is heat-resistant.

Furthermore, with respect to at least one of the pipes 15a and 15b, it is noted that at least one or each of said pipes 15a, 15b is further configured to siphon condensate with respect to the device under test 11 and/or the over-the-air measurement system especially with the aid of the temperature generating unit 14.

Figure 2:
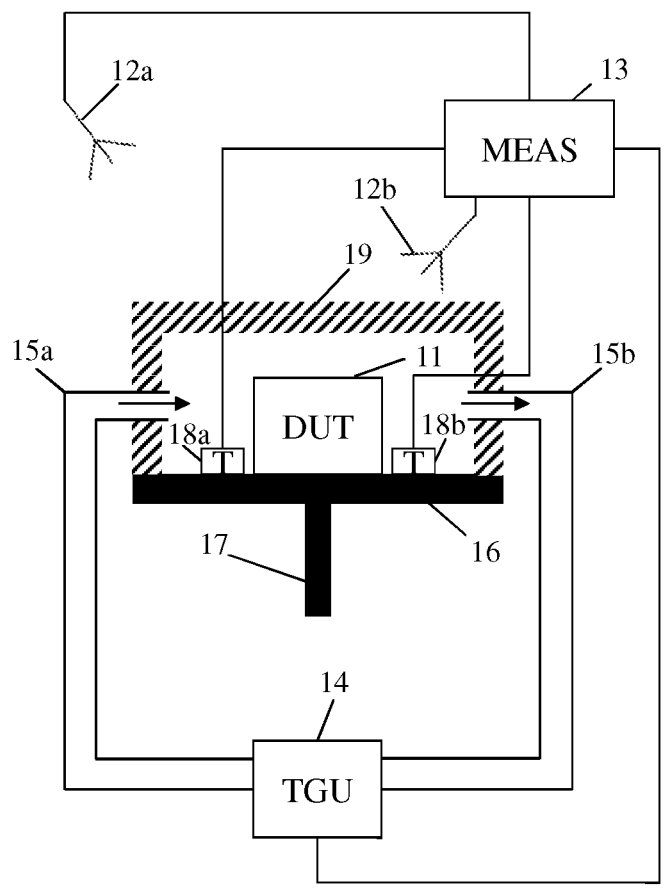
FIG. 2 shows a further exemplary embodiment of the first aspect of the invention.

Now, with respect to FIG. 2, a further exemplary embodiment of the over-the-air measurement system is shown, which is based on the one according to FIG. 1 with the difference that there is a second antenna 12b also connected to the measuring unit 13.

In this exemplary case, the antenna 12a is especially used as a measurement antenna and therefore equivalent to antenna 12 according to FIG. 1 for investigating the device under test 11 with the aid of the test signal, whereas said second antenna 12b is preferably used as a link antenna especially for transmitting and/or receiving control information, especially control information regarding the link between the second antenna 12b and the device under test 11, with respect to the device under test.

Additionally, with respect to said second antenna 12b, it is noted that the antenna 12b may be a single antenna, an antenna array, a near-field to far-field transform device, or an over-the-air probe. In this context, an over-the-air probe will exemplarily be explained according to FIG. 12. Further additionally, the second antenna 12b may preferably be movable, rotatable, tiltable, pivotable, or any combination thereof.

Figure 3:
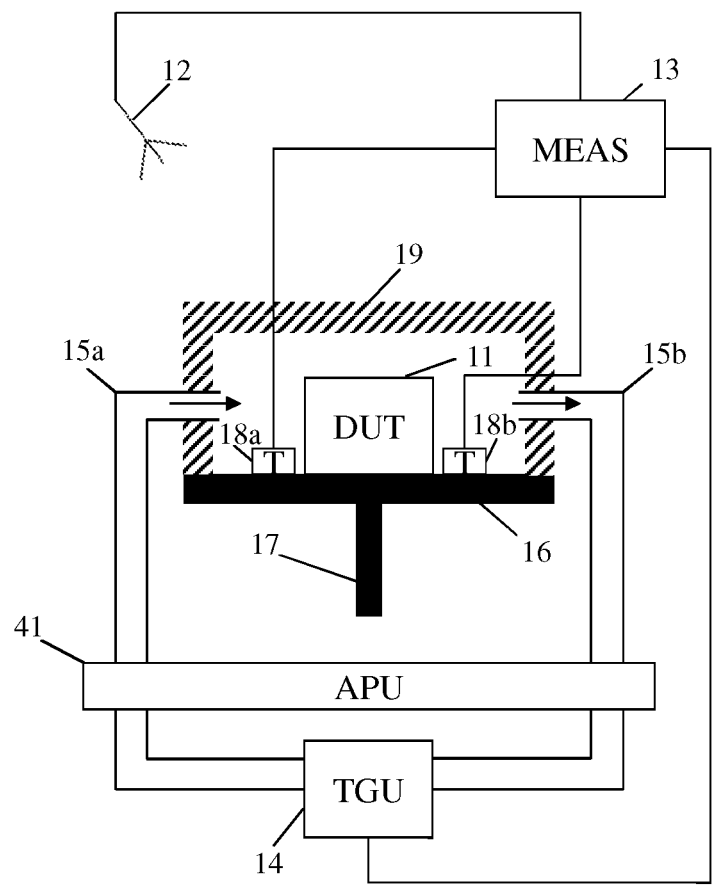
FIG. 3 shows a further exemplary embodiment of the first aspect of the invention.

Now, with respect to FIG. 3, a further exemplary embodiment of the over-the-air measurement system is illustrated, which is based on the one according to FIG. 1 with the difference that the over-the-air measurement system further comprises an air pressure adjusting unit 41 for creating a higher or a lower air pressure with respect to at least one of the pipes 15a and 15b of the piping system.

In this context, with the aid of the air pressure adjusting unit 41, preferably the first pipe 15a provides a higher air pressure and the second pipe 15b provides a lower air pressure such that a certain or circular flow of air is created with respect to the device under test 11. Advantageously, said certain flow of air may preferably be a user-defined flow of air.

In addition to this, said air pressure adjusting unit 41 may preferably be connected to the measuring unit 13 and/or to the temperature generating unit 14 in order to be controlled by at least one of said units.

Figure 4:
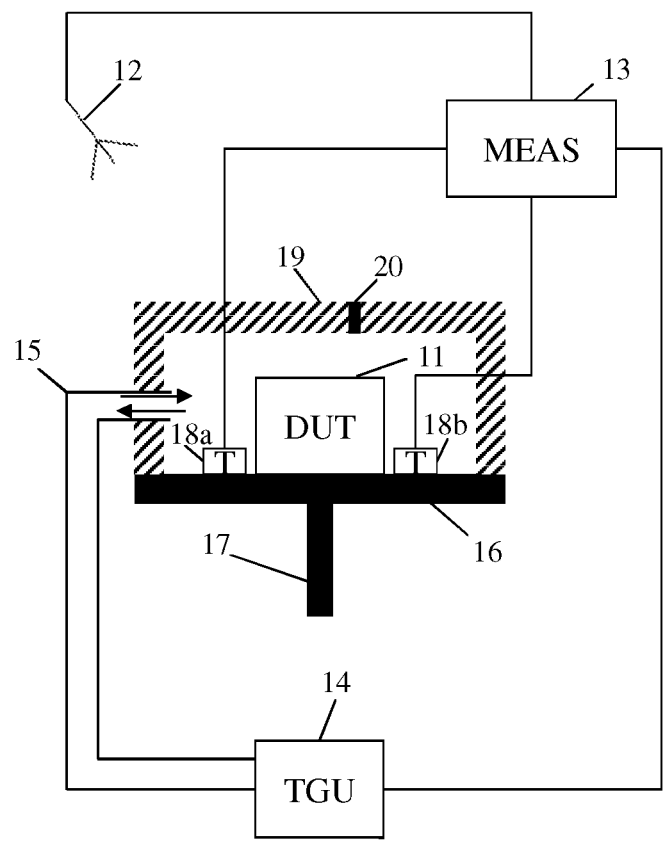
FIG. 4 shows a further exemplary embodiment of the first aspect of the invention.

Furthermore, FIG. 4 shows a further exemplary embodiment of the over-the-air measurement system based on the one according to FIG. 1 with the difference that the first pipe 15a and the second pipe 15b of the piping system are embodied as a single pipe 15 or tube.

In this context, said single pipe 15 or tube is configured to pass and to siphon air with respect to the device under test 11 being surrounded by the enveloping material 19. Additionally, said single pipe 15 or tube may preferably further configured to siphon condensate with respect to the device under test 11 and/or the over-the-air measurement system.

In addition to this, the enveloping material 19 comprises a pressure valve 20, preferably at least one pressure valve, which is configured to balance air pressure with respect to the device under test 11. Advantageously, with the aid of said at least one pressure valve or the pressure valve 20, respectively, heating or cooling can be accelerated because, for instance, passing heated air into the enveloping material 19 with the aid of the pipe 15 causes a rise of air pressure and therefore to an opening of the pressure valve 20, which leads to an outflow of air, especially cooler air already being within the enveloping material 19. Accordingly, temperature within the enveloping material 19 can be increased or decreased, respectively, more quickly.

Additionally or alternatively, the opening of the enveloping material 19 to which the pipe 15 is connected or at least one opening of the enveloping material 19, respectively, may preferably be configured to balance air pressure with respect to the device under test 11. Further additionally or alternatively, the enveloping material 19 may preferably comprise at least one additional cutout or recess configured to balance air pressure with respect to the device under test 11.

Figure 5:
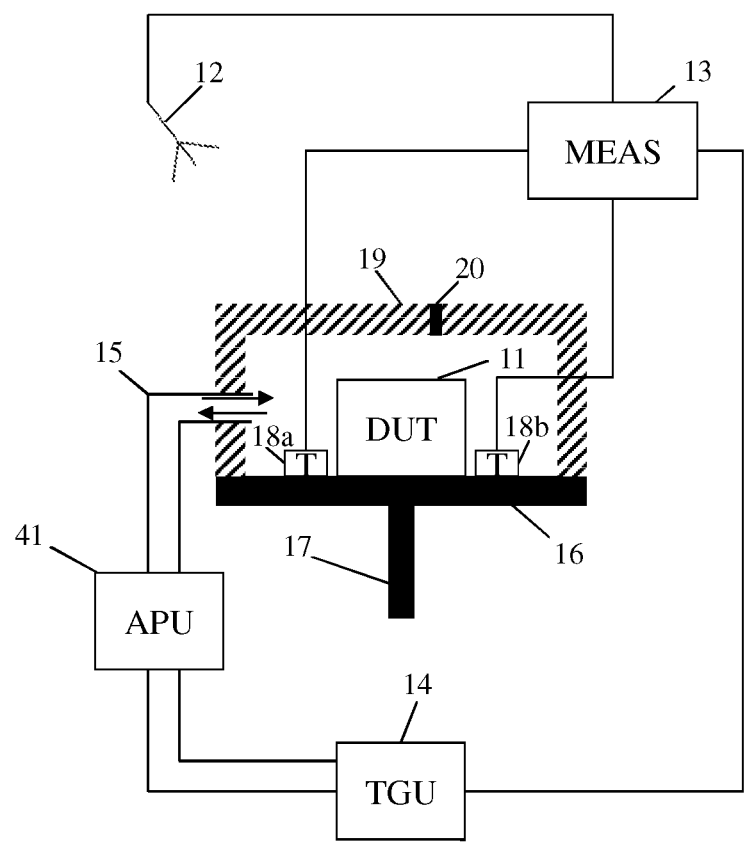
FIG. 5 shows a further exemplary embodiment of the first aspect of the invention.

Now, with respect to FIG. 5, a further exemplary embodiment of the over-the-air measurement system is illustrated, which is based on the one according to FIG. 4 with the difference that the over-the-air measurement system further comprises an air pressure adjusting unit 41 according to FIG. 3 for creating a higher or a lower air pressure with respect to the single pipe 15 or tube of the piping system.

Figure 6:
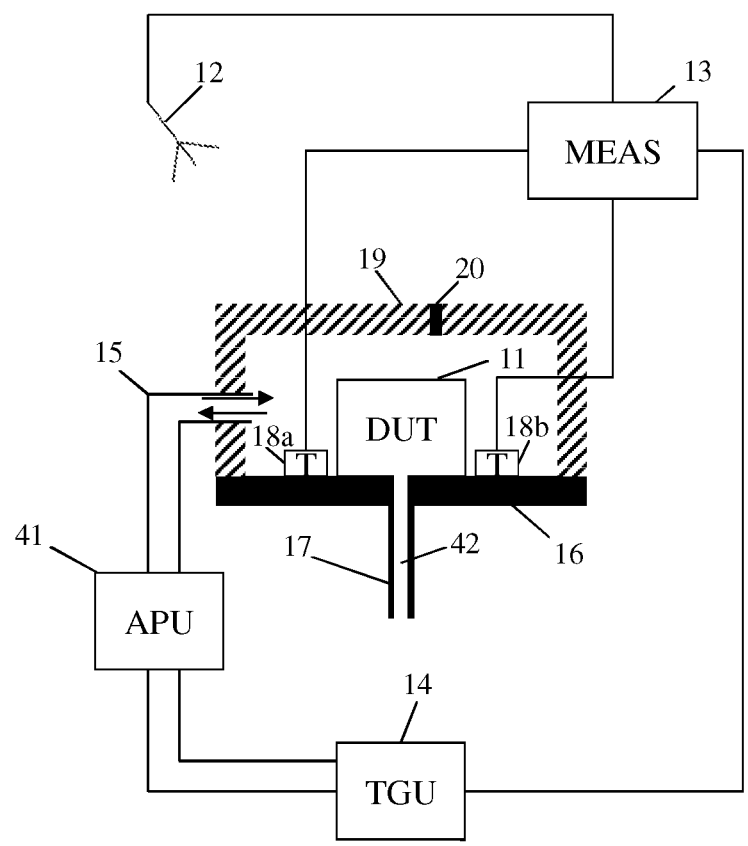
FIG. 6 shows a further exemplary embodiment of the first aspect of the invention.

Moreover, FIG. 6 illustrates a further exemplary embodiment of the over-the-air measurement system based on the one according to FIG. 5 with the difference that the over-the-air measurement system, especially the positioning unit comprising plane 16 and axis 17, further comprises an additional tube 42, preferably at least one additional tube, for siphoning condensate with respect to the device under test 11 and/or the over-the-air measurement system. Advantageously, said at least one additional tube may preferably be arranged in an area below the device under test 11 as the additional tube 42. Further advantageously, said at least one additional tube may preferably concentrically arranged within the axis 17 of the positioning unit as the tube 42.

Figure 7:
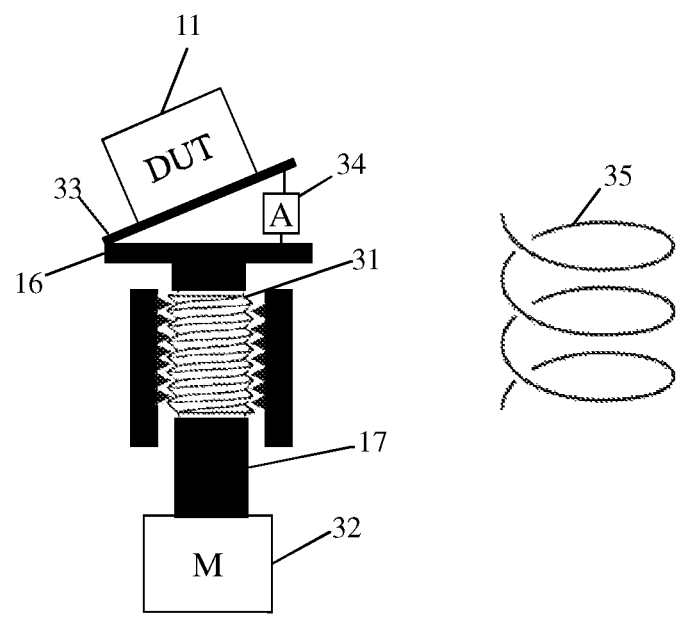
FIG. 7 shows a more detailed exemplary embodiment of a positioning unit.

In FIG. 7, an embodiment of the positioning unit is shown in greater detail. In this context, the positioning unit comprises a first plane 16 attached to a first end of an axis 17, wherein the axis 17 comprises a thread 31 for moving the plane 16 up and down with the aid of a motor 32 attached to a second end of the axis 17. As it can be seen, rotating the axis 17 with the aid of the motor 32 serves the height adjustment of the first plane 16, and thus also of the device under test 11.

Furthermore, the device under test 11 is attached to a second plane 33 which is attached to the first plane 16 in a tiltable manner. For the purpose of tilting the device under test 11, and thus for tilting the second plane 33 with respect to the first plane 16, the positioning unit comprises an actuator 34 which tilts the second plane 33 with respect to the first plane 16.

In addition to this, FIG. 7 illustrates an exemplary trace 35 of movement of the device under test 11 in the case that the device under test 11 is moved down in a tilted condition, which leads to the helical trace 35.

Figure 8:
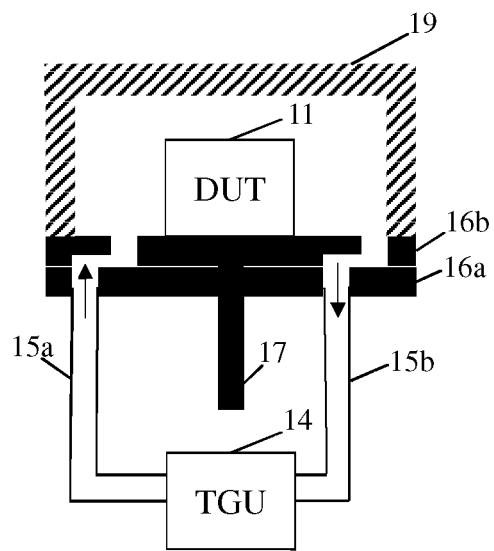
FIG. 8 shows a further exemplary embodiment of the first aspect of the invention.

Now, with respect to FIG. 8, a further exemplary embodiment of the over-the-air measurement system is shown, wherein the positioning system especially comprises the piping system.

In this exemplary case, the positioning unit comprises a first plane 16a being fixedly coupled to an axis 17. In addition to this, the positioning unit comprises a second plane 16b which is coupled to the axis 17 in turntable manner. The device under test is attached to said turntable plane 16b and surrounded by an enveloping material as already discussed above.

The first plane 16a comprises two through-holes for connecting a first pipe 15a and a second pipe 15b of the piping system. Each of said pipes of the piping system is connected to a temperature generating unit 14 as discussed above in order to pass or siphon, respectively, heated or cooled air generated by the temperature generating unit 14 into or from, respectively, the volume of the enveloping material 19 surrounding the device under test 11.

Furthermore, the second plane 16b is embodied as an abrasive ring or as a kind of an abrasive ring with respect to the first plane 16a in order to put through heated or cooled air into or from the volume of the enveloping material 19 surrounding the device under test 11.

Figure 9:
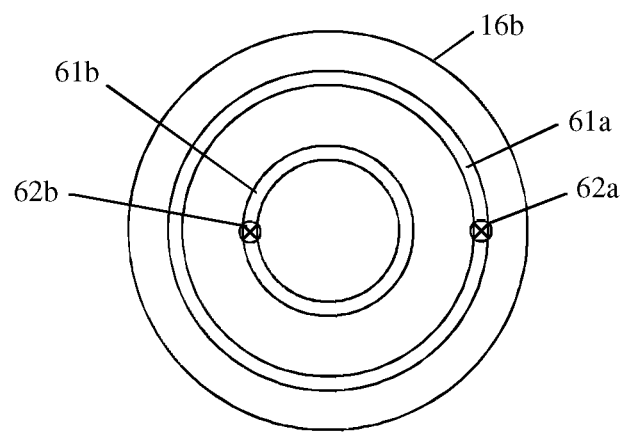
FIG. 9 shows a bottom view of an exemplary embodiment of a turntable of a positioning unit.

In this context, a bottom view of an exemplary embodiment of the second plane 16b embodied in an abrasive ring manner is shown in FIG. 9.

As it can be seen, the bottom of the second plane 16b comprises two concentric slots 61a and 61b not cutting through the plane 16b. Whereas the first circular slot 61a comprises a first through-hole 62a, the second circular slot 61b comprises a second through-hole 62b for putting through an respective flow of heated or cooled air.

Figure 10:
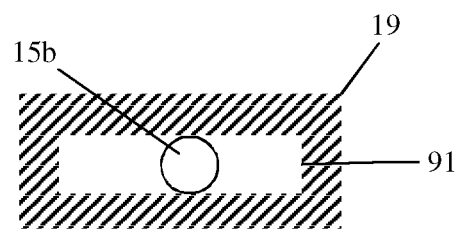
FIG. 10 shows a side view of an exemplary embodiment of an enveloping material.

Now, with respect to FIG. 10, a side view of an exemplary embodiment of an enveloping material 19 as discussed above is illustrated. Especially for the case that at least one pipe, exemplarily the above-mentioned pipe 15b, of the piping system is not tubular flexible, the enveloping material 19 comprises a slot 91 cutting through the enveloping material 19 surrounding the device under test 11 in order to ensure movability or rotatability despite a stiff pipe extending into the volume embraced by the enveloping material 19.

Figure 11:
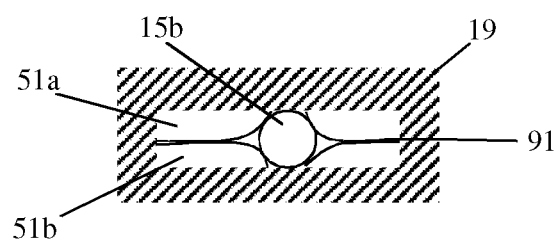
FIG. 11 shows a side view of a further exemplary embodiment of an enveloping material.

Furthermore, a further exemplary embodiment of said enveloping material 19 comprising a slot 91 is illustrated by FIG. 11. In this case, said slot 91 also cuts through the enveloping material 19. Due to the fact that the pipe 15b is especially not tubular flexible and preferably extends into the volume partially or completely embraced by the enveloping material 19, said slot 91 cutting through the enveloping material 19 especially allows for moving and/or rotating the device under test 11 and the enveloping material 19 despite the exemplarily stiff pipe 15b.

In this exemplary embodiment according to FIG. 11, the slot 91 additionally comprises a sealing arrangement in order to hold the desired temperature with respect to the device under test 11 by reducing thermal loss. In this exemplary case, the sealing arrangement is embodied as a rubber lip or a kind of rubber lip, which is preferably made of silicon. The rubber lip or said kind thereof comprises an upper lip 51a and a lower lip 51b, between which the pipe 15b can easily be moved due to the high flexibility of the sealing arrangement in the form of an upper lip 51a and a lower lip 51b which encompass the pipe 15b.

Figure 12:
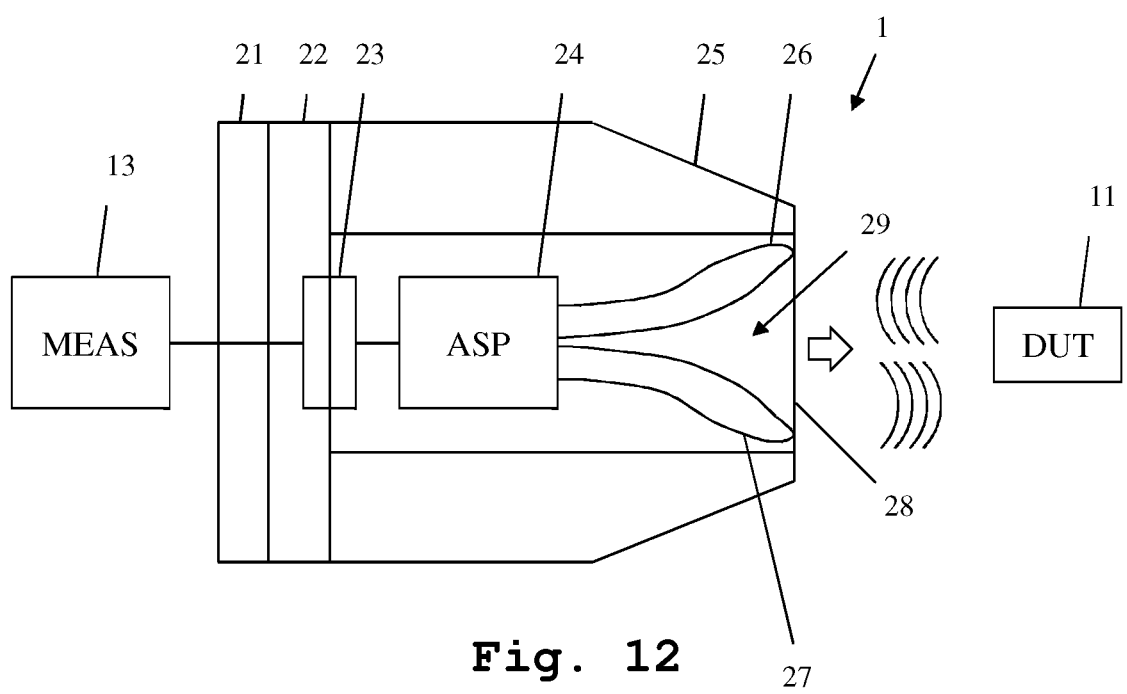
FIG. 12 shows an exemplary embodiment of an antenna in the form of an over-the-air probe.

Moreover, with respect to FIG. 12, an exemplary embodiment of the antenna 12 or 12a, respectively, is shown, wherein the antenna 12 or 12a is embodied in the form of an over-the-air probe 1. Additionally or alternatively, the above-mentioned antenna 12b may also be embodied in accordance with FIG. 12.

In FIG. 12, the over-the-air probe 1 comprises a housing 25 which contains a substrate 28, advantageously a printed circuit board. On the substrate 28, two antenna elements 26, 27 forming a tapered slot line antenna 29, are arranged. The antenna 29 is connected to an analog signal processor 24 which is also arranged on the substrate 28. The analog signal processor moreover is connected to a connector 23 which serves as an interface 23. Connectable to the interface 23 is the measuring unit 13, which is not part of the over-the-air probe 1. The antenna 29 has a main radiation direction towards the right edge of the substrate 28, indicated by an arrow. The device under test 11 is suitably arranged in this direction.

In order to minimize reflections from the over-the-air probe 1, the housing 25 is tapered towards the main radiation direction of the antenna 29. This tapering reduces the effective surface area, which can produce reflections. In order to further reduce such reflections, the housing 25 can be fabricated from an electromagnetic radiation absorbing material. It can also be covered with such a material or can be coated with an absorptive paint. The housing 25 furthermore comprises a back plate 21, which is covered with absorptive material 22 in order to further reduce reflections.

The over-the-air probe 1 is suitable for two types of measurements. In a first type of measurement, a first measuring signal emitted from the device under test 11 is received by the antenna 29 and handed to the analog signal processor 24. The analog signal processor 24 reduces the frequency of the first measuring signal resulting in a frequency reduced first measuring signal. This is for example done by down-converting the first measuring signal using a mixer. Additionally, the analog signal processor in this case can comprise one or more filters for filtering the first measuring signal or the frequency reduced first measuring signal, a power sensor, which can be used for directly measuring a power of the frequency reduced first measuring signal, an amplifier for amplifying the first measuring signal or the first frequency reduced measuring signal, and a radio frequency switch for switching between different measuring options. The processed frequency reduced measuring signal is then handed on to the connector 23, which passes on the signal to for example the measuring unit 13 for further processing the frequency reduced measuring signal.

Alternatively, the over-the-air probe 1 can be used for another type of measurement. In this case, the connector receives a frequency reduced second measuring signal from the measuring unit 13. It is handed on to the analog signal processor 24. The analog signal processor 24 increases the frequency of the frequency reduced second measuring signal resulting in a second measuring signal. This is for example done by mixing the frequency reduced second measuring signal with a further local oscillator signal. The second measuring signal is then transmitted by the antenna 29 to the device under test 11. Also, in this case, the analog signal processor can comprise additional components. The analog signal processor can comprise a filter, for filtering the second measuring signal and/or the second frequency reduced measuring signal. Also, the analog signal processor can comprise an amplifier for amplifying the second measuring signal and/or the second frequency reduced measuring signal. Moreover, the analog signal processor can comprise a radio frequency switch, adapted to switch between different operating modes of the over-the-air probe 1.

Figure 13:
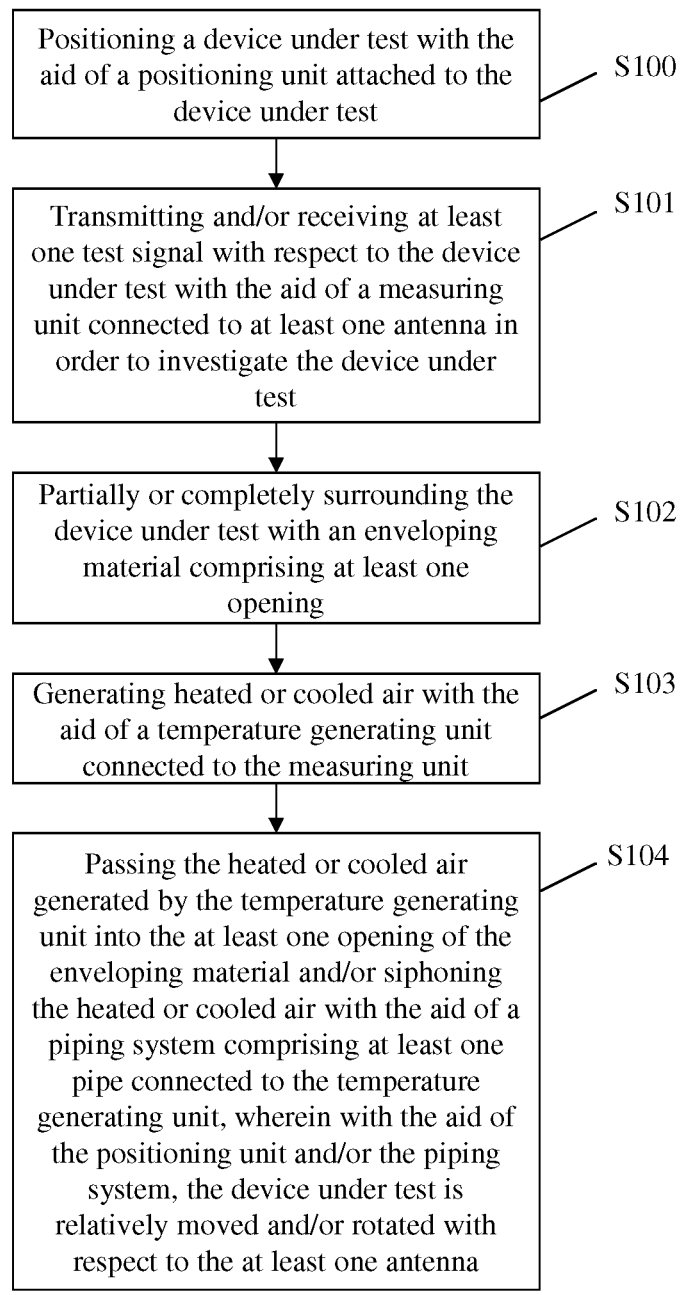
FIG. 13 shows a flow chart of an exemplary embodiment of the second aspect of the invention.

Finally, FIG. 13 shows a flow chart of an exemplary embodiment of the inventive method. In a first step S100, a device under test is positioned with the aid of a positioning unit attached to the device under test. According to a second step S101, at least one test signal is transmitted and/or received with respect to the device under test with the aid of a measuring unit connected to at least one antenna in order to investigate the device under test. Then, in a third step S102, the device under test is partially or completely surrounded with enveloping material comprising at least one opening. Furthermore, in a fourth step S103, heated or cooled air is generated with the aid of a temperature generating unit connected to the measuring unit. Finally, in a fifth step S104, the heated or cooled air generated by the temperature generating unit is passed into the at least one opening of the radio frequency neutral material and/or the heated or cooled air is siphoned with the aid of a piping system comprising at least one pipe connected to the temperature generating unit, wherein with the aid of the positioning unit and/or the piping system, the device under test is relatively moved and/or rotated with respect to the at least one antenna.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above-described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An over-the-air measurement system for investigating a device under test with respect to its temperature behavior, the over-the air measurement system comprising:
   a positioning unit attached to the device under test for positioning the device under test,
   at least one antenna,
   a temperature generating unit for generating heated or cooled air,
   an air pressure adjusting unit, and
   a piping system comprising at least one pipe connected to the temperature generating unit for passing the heated or cooled air generated by the temperature generating unit into at least one opening of an enveloping material surrounding the device under test and/or for siphoning the heated or cooled air,
   wherein the positioning unit and the piping system are configured to relatively move and/or rotate the device under test with respect to the at least one antenna,
   wherein the device under test is surrounded by the enveloping material in order to hold the desired temperature with respect to the device under test,
   wherein the enveloping material comprises at least one pressure valve being configured to balance air pressure with respect to the device under test,
   wherein the air pressure adjusting unit is configured to create a user-defined flow of air with respect to the at least one pipe of the piping system,
   wherein the positioning unit comprises a plane being arranged rotatable around an axis,
   wherein the positioning unit further comprises at least one additional tube for siphoning condensate with respect to the device under test, and
   wherein said at least one additional tube is concentrically arranged within the axis.

2. The over-the-air measurement system according to claim 1,
   wherein the over-the-air measurement system further comprises a measuring unit connected to the at least one antenna for transmitting and/or receiving at least one test signal with respect to the device under test in order to investigate the device under test.

3. The over-the-air measurement system according to claim 2,
   wherein the over-the-measurement system further comprises at least one temperature sensor connected to the measuring unit or the temperature generating unit for monitoring an ambient temperature in the area of the device under test.

4. The over-the-air measurement system according to claim 1,
   wherein the at least one antenna is a single antenna, an antenna array, a near-field to far-field transform device, or an over-the-air probe.

5. The over-the-air measurement system according to claim 1,
   wherein the enveloping material is a radio frequency neutral material, or
   wherein the enveloping material partially or completely surrounds the device under test with respect to a certain measurement direction.

6. The over-the-air measurement system according to claim 1,
   wherein the air pressure adjusting unit creates a higher or a lower air pressure with respect to the at least one pipe of the piping system.

7. The over-the-air measurement system according to claim 6,
   wherein the piping system comprises at least two pipes, wherein with the aid of the air pressure adjusting unit, at least one first pipe provides a higher air pressure and at least one second pipe provides a lower air pressure, wherein a certain or circular flow of air is created with respect to the device under test.

8. The over-the-air measurement system according to claim 1,
   wherein the at least one opening of the enveloping material is configured to balance air pressure with respect to the device under test, or
   wherein the enveloping material comprises at least one additional cutout or recess configured to balance air pressure with respect to the device under test.

9. The over-the-air measurement system according to claim 1,
   wherein the at least one opening of the enveloping material comprises a heat-resistant connection area for connecting the at least one pipe of the piping system, or
   wherein an area of the enveloping material partially or completely surrounding the at least one opening of the enveloping material is heat-resistant.

10. The over-the-air measurement system according to claim 1, wherein the positioning unit comprises the piping system.

11. The over-the-air measurement system according to claim 1, wherein the at least one pipe of the piping system is embodied as a single tube.

12. The over-the-air measurement system according to claim 1, wherein the enveloping material is embodied as a not fully radio frequency neutral material.

13. The over-the-air measurement system according to claim 12, wherein the not fully radio frequency neutral material comprises metal, wherein a metallic portion with respect to the not fully radio frequency neutral material is between 40% and 60%.

14. The over-the-air measurement system according to claim 1,
   wherein with the aid of the temperature generating unit, the at least one pipe is configured to siphon condensate with respect to the device under test and/or the over-the-air measurement system.

15. An over-the-air measurement method for investigating a device under test with respect to its temperature behavior, the over-the air measurement method comprises the steps of:

positioning the device under test with the aid of a positioning unit attached to the device under test, transmitting and/or receiving at least one test signal with respect to the device under test with the aid of a measuring unit connected to at least one antenna in order to investigate the device under test, partially or completely surrounding the device under test with enveloping material comprising at least one opening, generating heated or cooled air with the aid of a temperature generating unit connected to the measuring unit, passing the heated or cooled air generated by the temperature generating unit into the at least one opening of the enveloping material and/or siphoning the heated or cooled air with the aid of a piping system comprising at least one pipe connected to the temperature generating unit, and creating, with the aid of an air pressure adjusting unit, a user-defined flow of air with respect to the at least one pipe of the piping system, wherein with the aid of the positioning unit and/or the piping system, the device under test is relatively moved and/or rotated with respect to the at least one antenna, wherein the device under test is surrounded by the enveloping material in order to hold the desired temperature with respect to the device under test, wherein the enveloping material comprises at least one pressure valve being configured to balance air pressure with respect to the device under test, wherein the positioning unit comprises a plane being arranged rotatable around an axis, wherein the positioning unit further comprises at least one additional tube for siphoning condensate with respect to the device under test, and wherein said at least one additional tube is concentrically arranged within the axis.

* * * * *